US010108285B1

(12) United States Patent
Lee et al.

(10) Patent No.: US 10,108,285 B1
(45) Date of Patent: Oct. 23, 2018

(54) IN-CELL OLED TOUCH DISPLAY PANEL STRUCTURE WITH HIGH TOUCH DETECTION SENSITIVITY AND NARROW BORDER

(71) Applicant: SuperC-Touch Corporation, New Taipei (TW)

(72) Inventors: Hsiang-Yu Lee, New Taipei (TW); Shang Chin, New Taipei (TW); Ping-Tsun Lin, New Taipei (TW); Chia-Hsun Tu, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 6 days.

(21) Appl. No.: 15/491,558

(22) Filed: Apr. 19, 2017

(51) Int. Cl.
*G09G 3/30* (2006.01)
*G06F 3/044* (2006.01)
*G06F 3/041* (2006.01)
*G09G 3/3266* (2016.01)
*G09G 3/3275* (2016.01)
*G09G 3/3225* (2016.01)
*H01L 27/32* (2006.01)

(52) U.S. Cl.
CPC .......... *G06F 3/0412* (2013.01); *G06F 3/0416* (2013.01); *G09G 3/3225* (2013.01); *G09G 3/3266* (2013.01); *G09G 3/3275* (2013.01); *H01L 27/323* (2013.01); *H01L 27/3262* (2013.01); *H01L 27/3276* (2013.01); *G06F 2203/04112* (2013.01); *G09G 2300/0426* (2013.01); *G09G 2310/0291* (2013.01)

(58) Field of Classification Search
CPC .. G09G 3/12–3/14; G09G 3/30–3/3291; G06F 3/041–3/0418; G06F 2203/0339–2203/04809
See application file for complete search history.

(56) References Cited

U.S. PATENT DOCUMENTS

| 2013/0257785 A1* | 10/2013 | Brown | G06F 3/044 345/174 |
| 2014/0063385 A1* | 3/2014 | Yang | G06F 3/044 349/15 |
| 2015/0242025 A1* | 8/2015 | Cok | G06F 3/046 29/622 |
| 2017/0185202 A1* | 6/2017 | Qu | G06F 3/0412 |

* cited by examiner

*Primary Examiner* — Sanghyuk Park
(74) *Attorney, Agent, or Firm* — Muncy, Geissler, Olds & Lowe, P.C.

(57) ABSTRACT

An in-cell OLED touch display panel structure includes a first electrode layer and a second electrode layer. The first electrode layer includes a plurality of first electrodes arranged along a first direction, a plurality of isolation electrodes, and a plurality of second electrode connection lines. The second electrode layer includes a plurality of second electrodes arranged along a second direction. Each of the second electrodes extends to one edge of the in-cell OLED touch display panel structure through a corresponding second electrode connection line. The first electrode layer and the second electrode layer are both disposed at one side of a common electrode layer opposite to an OLED layer.

18 Claims, 14 Drawing Sheets

IN-CELL OLED TOUCH DISPLAY PANEL STRUCTURE WITH HIGH TOUCH DETECTION SENSITIVITY AND NARROW BORDER

BACKGROUND OF THE INVENTION

1. Field of the Invention

The present disclosure relates to a structure of touch display panel and, more particularly, to an in-cell OLED touch display panel structure with high touch detection sensitivity and narrow border.

2. Description of Related Art

In recent years, the flat panel display industry has been rapidly developed, and many products have also been made in pursuit of light weight, thinness, small volume and fine image quality, so as to develop several types of flat panel displays to replace traditional cathode ray tube display (CRT). The flat panel displays are classified as liquid crystal display (LCD), plasma display panel (PDP), organic light emitting diode (OLED) display, field emission display (FED), and vacuum fluorescence display (VFD).

Among these types of flat panel displays, the organic light emitting diode display (OLED) technology is the one with great potential. The OLED display is provided with not only the advantages of LCD display including thinness, power-saving and full-color display, but also the features of wide viewing angle, self-illumination, and fast response that are better than LCD.

Modern consumer electronic apparatuses are typically equipped with touch panels for use as their input devices. With the widespread use of smart phones, the multi-touch technique is getting more and more important. Currently, the multi-touch is generally implemented by projected capacitive touch technique.

FIG. 1 is a schematic diagram of a prior touch panel structure 100. On this prior touch panel structure 100, the sensing conductor lines 110, 120 are arranged in in the first direction (X-direction) and second direction (Y-direction). When a touch sensing is being performed and the sensing conductor lines 120 have to receive the touch signals from the touch control circuit 131 on a flexible circuit board 130, a great amount of wires at the side of the panel 140 is required for connection to the flexible circuit board 130. Such a prior design increases the border width of the touch panel and thus is not suitable for the trend of narrow border.

Therefore, it is desirable to provide an improved touch display panel structure to mitigate and/or obviate the aforementioned problems.

SUMMARY OF THE INVENTION

The object of the present invention is to provide an in-cell OLED touch display panel structure with high touch detection sensitivity and narrow border, which not only significantly increases the touch detection accuracy but also greatly saves the material cost and the manufacturing cost, and which is more suitable for narrow border design than the prior art.

According to one aspect of the disclosure, an in-cell OLED touch display panel structure with high touch detection sensitivity and narrow border is provided, which comprises a thin film transistor (TFT) substrate, a common electrode layer, an OLED layer, an encapsulation layer, a first electrode layer, and a second electrode layer. The TFT substrate has a surface formed thereon a plurality of display TFTs, a plurality of display pixel electrodes, a plurality of gate lines, and a plurality of data lines. The OLED layer is disposed between the TFT substrate and the common electrode layer. The encapsulation layer is disposed at one side of the common electrode layer opposite to the OLED layer. The first electrode layer includes a plurality of first electrodes arranged along a first direction, a plurality of isolation electrodes, and a plurality of second electrode connection lines. The second electrode layer includes a plurality of second electrodes arranged along a second direction. Each of the second electrodes extends to one edge of the in-cell OLED touch display panel structure through a corresponding second electrode connection line. The first electrode layer and the second electrode layer are both disposed at one side of the common electrode layer opposite to the OLED layer.

According to another aspect of the disclosure, an in-cell OLED touch display panel structure with high touch detection sensitivity and narrow border is provided, which comprises a thin film transistor (TFT) substrate, a common electrode layer, an OLED layer, an encapsulation layer, a first electrode layer, and a second electrode layer. The TFT substrate has a surface formed thereon a plurality of display TFTs, a plurality of display pixel electrodes, a plurality of gate lines, and a plurality of data lines. The OLED layer is disposed between the TFT substrate and the common electrode layer. The encapsulation layer is disposed at one side of the common electrode layer opposite to the OLED layer. The first electrode layer includes a plurality of first mesh electrodes arranged along a first direction, a plurality of isolation electrodes, and a plurality of second mesh electrode connection lines. The second electrode layer includes a plurality of second mesh electrodes arranged along a second direction. Each of the second mesh electrodes extends to one edge of the in-cell OLED touch display panel structure through a corresponding second mesh electrode connection line. The first electrode layer and the second electrode layer are both disposed at one side of the common electrode layer opposite to the OLED layer. The mesh lines of the first mesh electrodes and mesh lines of the second mesh electrodes are dislocated and non-overlapped with each other.

DETAILED DESCRIPTION OF THE PREFERRED EMBODIMENT

Figure 2:
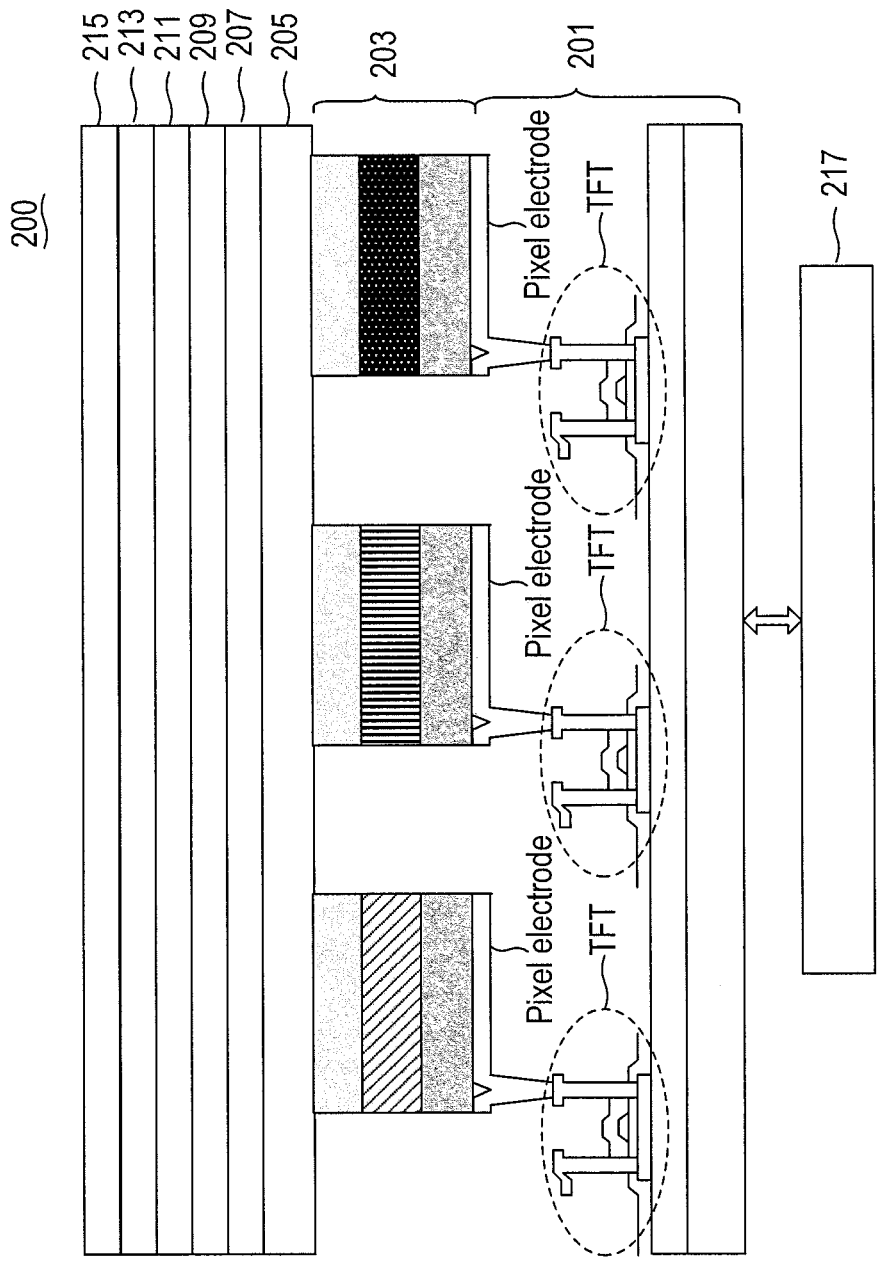
FIG. 2 is a first stack-up diagram of the in-cell OLED touch display panel structure with high touch detection sensitivity and narrow border in accordance with the present disclosure.

With reference to FIG. 2, there is shown a first stack-up diagram of the in-cell OLED touch display panel structure with high touch detection sensitivity and narrow border in accordance with the present disclosure. As shown, the in-cell OLED touch display panel structure 200 includes a thin film transistor (TFT) substrate 201, an OLED layer 203, a common electrode layer 205, an encapsulation layer 207, a second electrode layer 209, an insulation layer 211, a first electrode layer 213, a touch protective layer 215, and a display control circuit 217.

Figure 11:
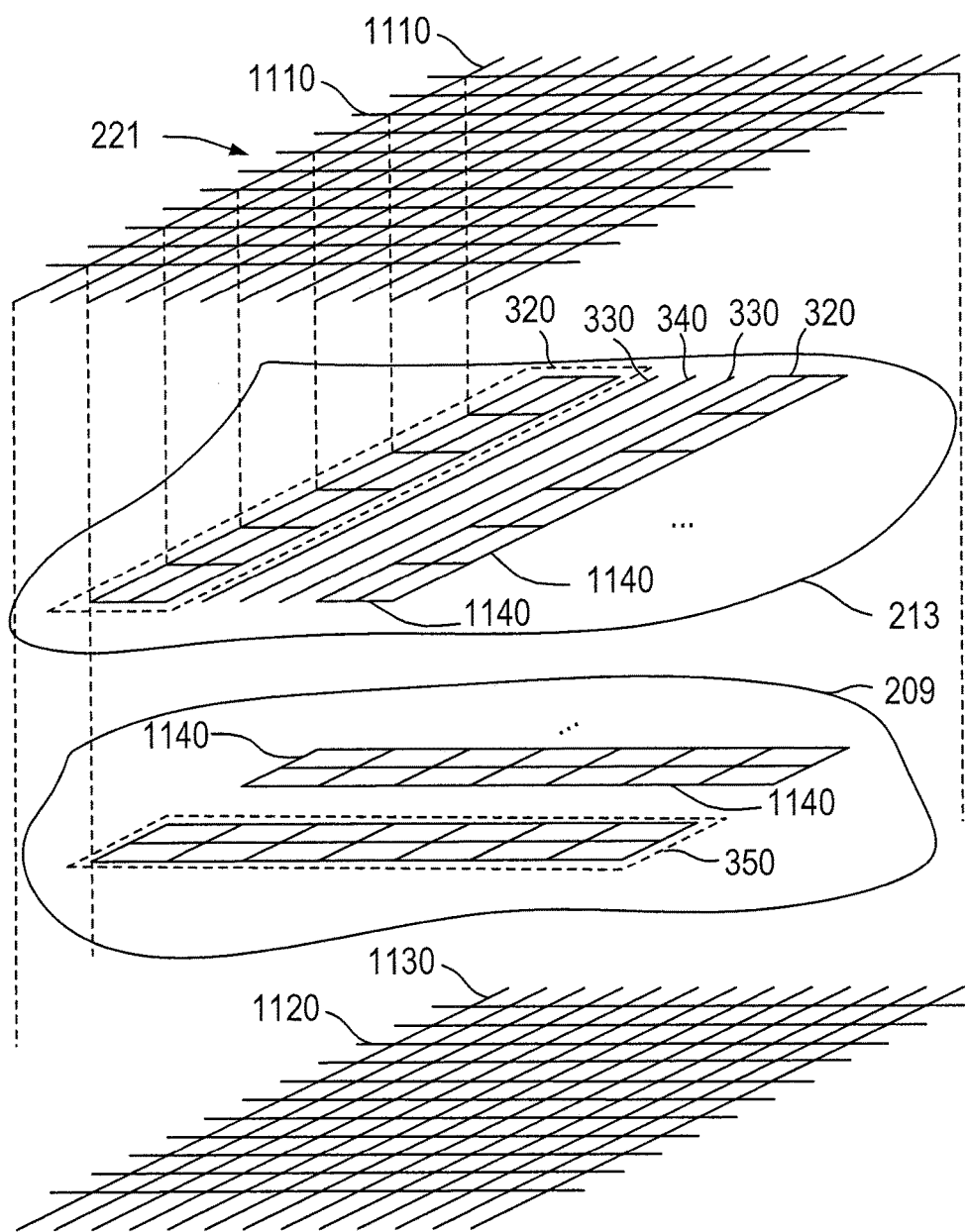
FIG. 11 is a schematic view of the black matrix layer, first electrode layer, second electrode layer and TFT substrate of the in-cell OLED touch display panel structure in accordance with the present disclosure.

The TFT substrate 201 has a surface formed thereon a plurality of display TFTs, a plurality of display pixel electrodes, a plurality of gate lines and a plurality of data lines (in which the gate lines and data lines are well-known to those skilled in the field of display devices and thus are only shown in FIG. 11 with numerals 1120 and 1130).

The OLED layer 203 is disposed between the TFT substrate 201 and the common electrode layer 205.

The encapsulation layer 207 is disposed at one side of the common electrode layer 205 opposite to the OLED layer 203.

The second electrode layer 209 is disposed at one side of the encapsulation layer 207 opposite to the OLED layer 203.

The first electrode layer 213 is disposed at one side of the encapsulation layer 207 opposite to the OLED layer 203.

The insulation layer 211 is disposed between the first electrode layer 213 and the second electrode layer 209.

The touch protective layer 215 is disposed at one side of the encapsulation layer 207 opposite to the OLED layer 203.

The first electrode layer 213 and the second electrode layer 209 are both disposed at one side of the common electrode layer 205 opposite to the OLED layer 203.

The display control circuit 217 sequentially outputs a scan signal to one gate line (not shown), outputs data signals to corresponding data lines (not shown), and outputs a zero voltage signal, a negative voltage signal or a positive voltage signal to the common electrode layer 205 for performing a display operation, and the plurality of pixel electrodes have polarity opposite to that of the common electrode layer (i.e. if the pixel electrode is anode, the common electrode layer is cathode; if the pixel electrode is cathode, the common electrode layer is anode).

Figure 3:
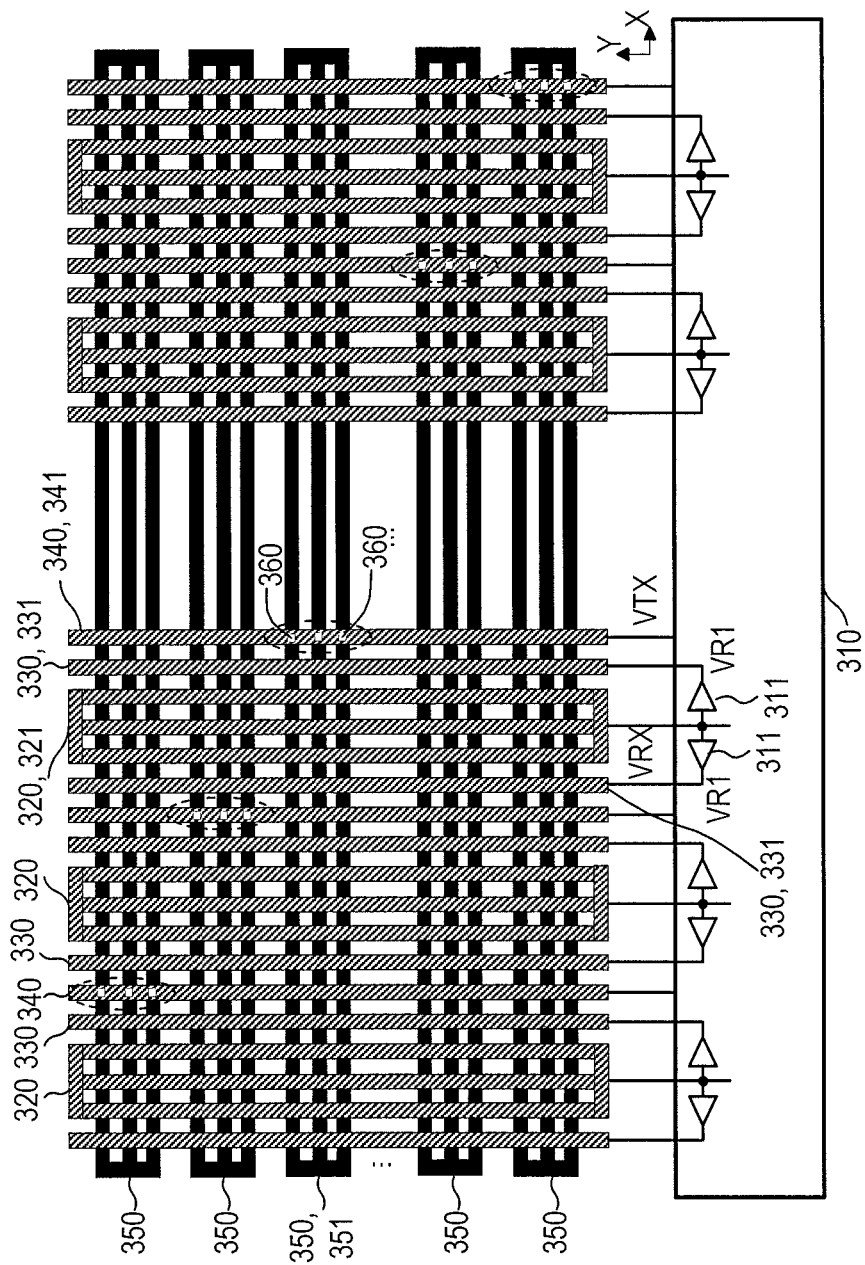
FIG. 3 is a first schematic diagram of the first electrode layer, second electrode layer and touch control circuit of the in-cell OLED touch display panel structure in accordance with the present disclosure.

FIG. 3 is a first schematic diagram of the first electrode layer, second electrode layer and touch control circuit of the in-cell OLED touch display panel structure in accordance with the present disclosure. As shown in FIG. 3, the in-cell OLED touch display panel structure 200 further includes a touch control circuit 310. The first electrode layer 213 includes a plurality of first electrodes 320 arranged along a first direction (X-axis direction), a plurality of isolation electrodes 330, and a plurality of second electrode connection lines 340.

The second electrode layer 209 includes a plurality of second electrodes 350 arranged along a second direction (Y-axis direction). Each of the second electrodes extends to one edge of the in-cell OLED touch display panel structure 200 through a corresponding second electrode connection line 340.

Each of the isolation electrode 330 and the second electrode connection line 340 is a long strip metal line. The isolation electrode 330 is arranged between one first electrode 320 and one second electrode connection line 340 to prevent the first electrode 320 from being interfered by a touch stimulation signal VTX on the second electrode connection line 340.

Each of the first electrodes 320 includes a plurality of parallel metal lines to form a receiving electrode, and each of the second electrodes 350 includes a plurality of parallel metal lines to form a transmitting electrode. The second electrode 350 is connected to the second electrode connection line 340 through the vias 360.

The touch control circuit 310 sequentially or randomly couples a touch stimulation signal VTX to a selected second electrode 351 by the second electrode connection line 341, and receives a touch sense signal VRX from a selected first electrode 321. The touch sense signal VRX is driven by an in-phase amplifier 311 to generate an in-phase isolation signal VR1, where the in-phase amplifier 311 has a gain greater than 0. The in-phase isolation signal VR1 is coupled to the isolation electrodes 331 corresponding to the selected first electrode 321 for performing the touch detection operation.

Owing to the isolation electrode 331 being arranged between the selected first electrode 321 and the second electrode connection line 341, it can prevent the selected first electrode 321 from being interfered by a touch stimulation signal VTX on the second electrode connection line 341. Thus, the touch detection accuracy can be dramatically increased.

In the present disclosure, the touch control circuit 310 couples the touch stimulation signal VTX to a selected second electrode 351. More specifically, the touch control circuit 310 directly outputs the touch stimulation signal VTX to the selected second electrode 351, or the touch control circuit 310 outputs the touch stimulation signal VTX through a passive component to the selected second electrode 351, where the passive component can be a resistor, a capacitor, or a inductor.

Figure 4:
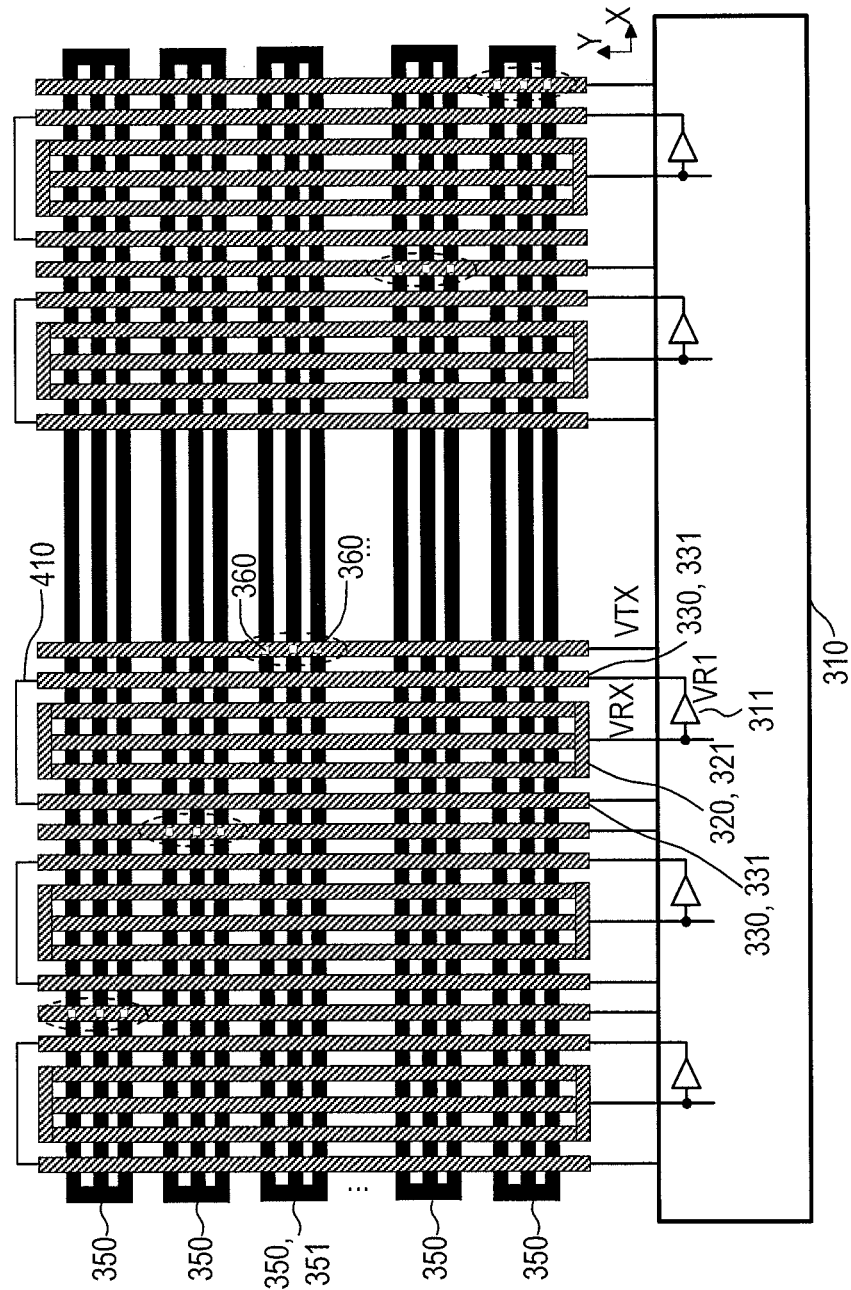
FIG. 4 is a second schematic diagram of the first electrode layer, second electrode layer and touch control circuit of the in-cell OLED touch display panel structure in accordance with the present disclosure.

FIG. 4 is a second schematic diagram of the first electrode layer, second electrode layer and touch control circuit of the in-cell OLED touch display panel structure in accordance with the present disclosure. As shown in FIG. 4, the isolation electrodes 331 corresponding to the selected first electrode 321 are connected to each other through a connection trace 410, and thus the number of the in-phase amplifiers 311 can be reduced for saving the cost of the touch control circuit 310.

Figure 5:
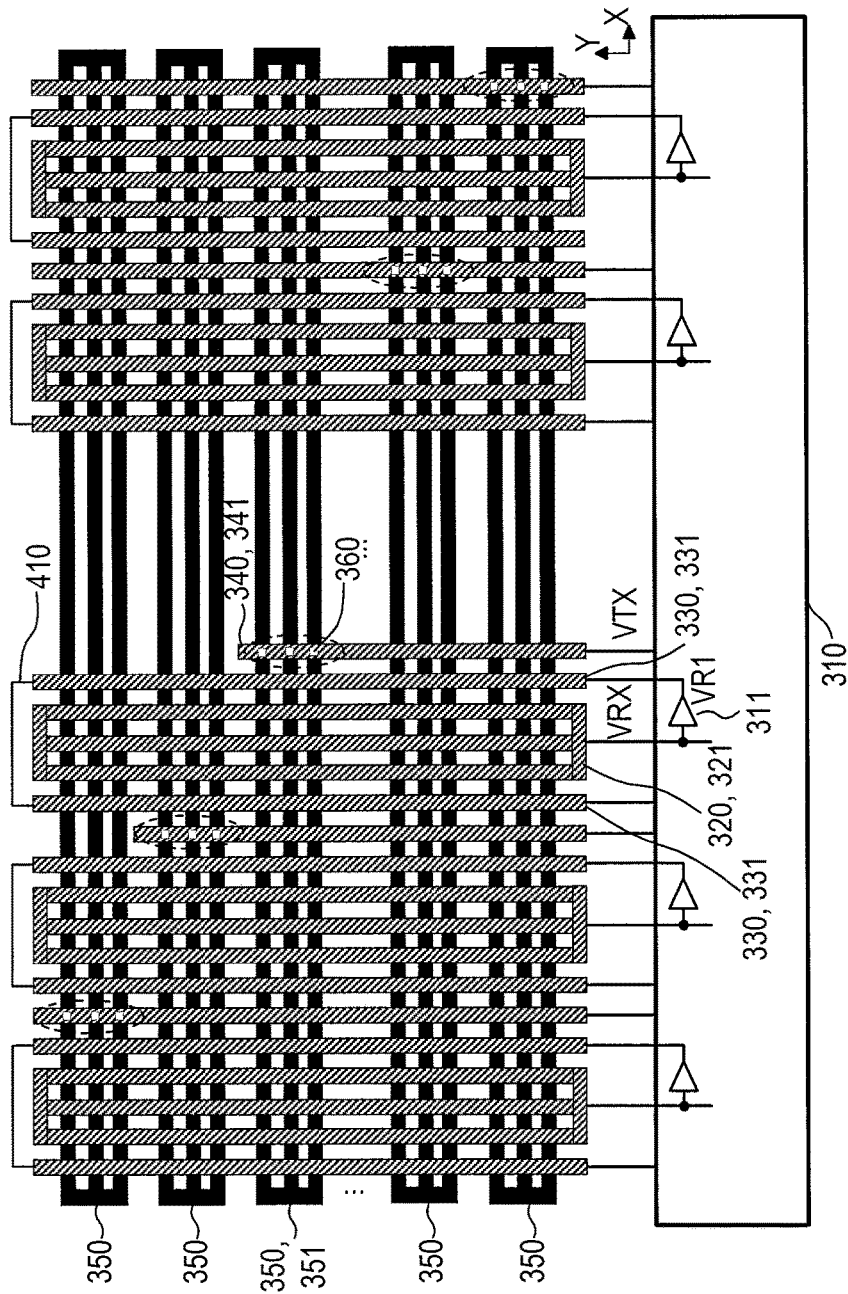
FIG. 5 is a third schematic diagram of the first electrode layer, second electrode layer and touch control circuit of the in-cell OLED touch display panel structure in accordance with the present disclosure.

FIG. 5 is a third schematic diagram of the first electrode layer, second electrode layer and touch control circuit of the in-cell OLED touch display panel structure in accordance with the present disclosure. As shown in FIG. 5, the second electrode connection line 341 only extends to the corresponding second electrode 351 rather than to the edge of the in-cell OLED touch display panel structure 200 that is opposite to that edge provided with the touch control circuit 310.

Figure 6:
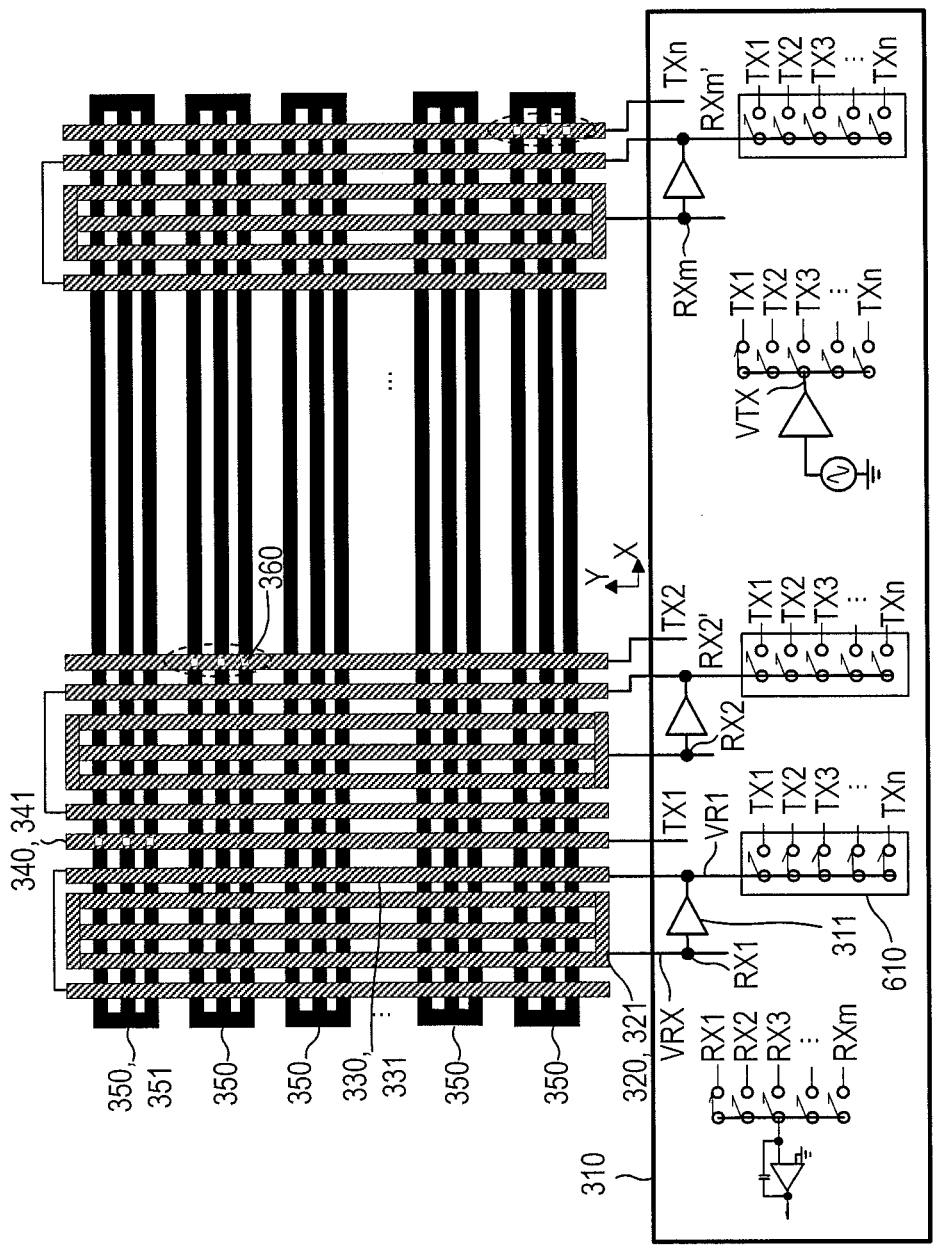
FIG. 6 is a fourth schematic diagram of the first electrode layer, second electrode layer and touch control circuit of the in-cell OLED touch display panel structure in accordance with the present disclosure.

FIG. 6 is a fourth schematic diagram of the first electrode layer, second electrode layer and touch control circuit of the in-cell OLED touch display panel structure in accordance with the present disclosure, in which the touch control circuit 310 couples the in-phase isolation signal VR1 to the second electrodes 350 exclusive of the selected second electrode 351.

As shown in FIG. 6, the touch stimulation signal VTX is applied to node TX1 through a switch, and then to the selected second electrode 351 through the second electrode connection line 341. The touch sense signal VRX from a selected first electrode 321 is sent to the in-phase amplifier 311 through the node RX1. The touch sense signal VRX is driven by an in-phase amplifier 311 to generate an in-phase isolation signal VR1, wherein the in-phase amplifier 311 has a gain greater than 0. The in-phase isolation signal VR1 is coupled to the isolation electrodes 331 corresponding to the selected first electrode 321 for performing the touch detection operation.

Moreover, the in-phase isolation signal VR1 is also sent to a switch set 610 including a plurality of switches. In the switch set 610, all switches are in an ON state except the switch connected to node TX1. Thus, the in-phase isolation signal VR1 is sent to the second electrodes 350, exclusive of the selected second electrode 351, through the nodes TX2, TX3, . . . , TXn.

Figure 7:
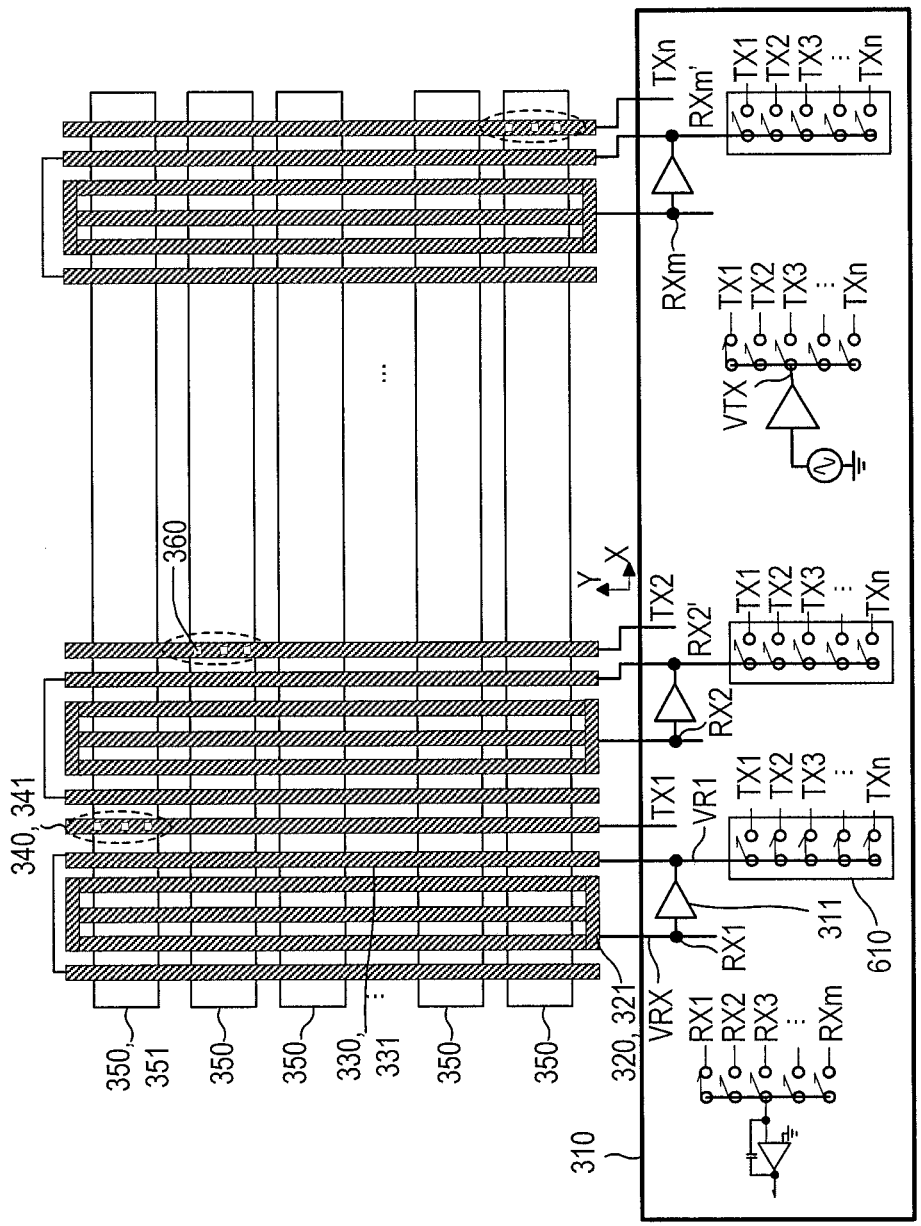
FIG. 7 is a fifth schematic diagram of the first electrode layer, second electrode layer and touch control circuit of the in-cell OLED touch display panel structure in accordance with the present disclosure.

FIG. 7 is a fifth schematic diagram of the first electrode layer, second electrode layer and touch control circuit of the in-cell OLED touch display panel structure in accordance with the present disclosure, which is similar to FIG. 6 except that, in FIG. 7, each of the second electrodes 350 is a transparent conductive electrode made of transparent material selected from the group consisting of ITO, ZTO, IZO, conductive polymer, carbon nanotube, graphene, and silver film with a thickness smaller than 50 nanometers.

Figure 8:
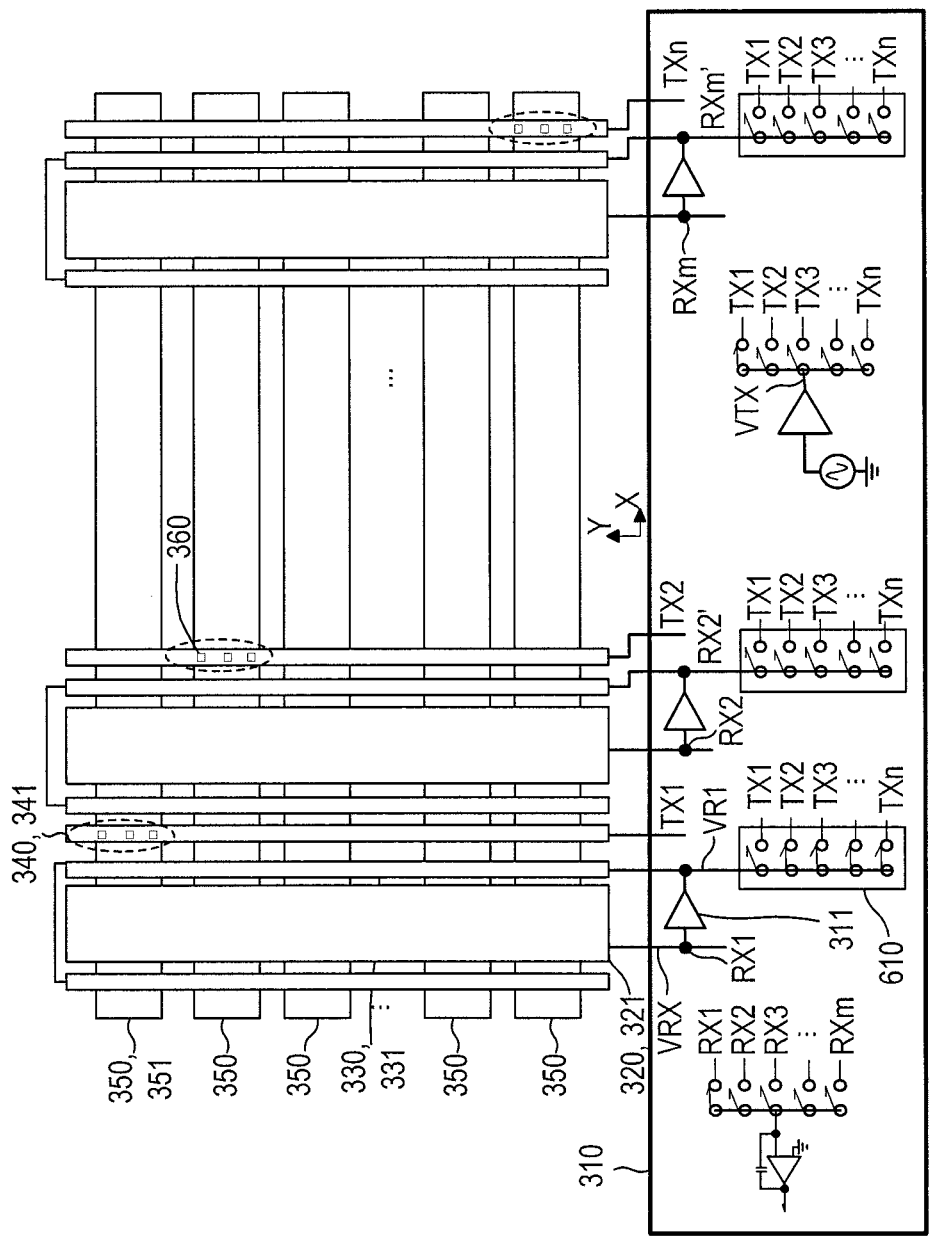
FIG. 8 is a sixth schematic diagram of the first electrode layer, second electrode layer and touch control circuit of the in-cell OLED touch display panel structure in accordance with the present disclosure.

FIG. 8 is a sixth schematic diagram of the first electrode layer, second electrode layer and touch control circuit of the in-cell OLED touch display panel structure in accordance with the present disclosure, which is similar to FIG. 7 except that, in FIG. 8, the first electrodes 320, the isolation electrodes 330, and the second electrode connection lines 340 are made of transparent material selected from the group consisting of ITO, ZTO, IZO, conductive polymer, carbon nanotube, graphene, and silver film with a thickness smaller than 50 nanometers.

Figure 9:
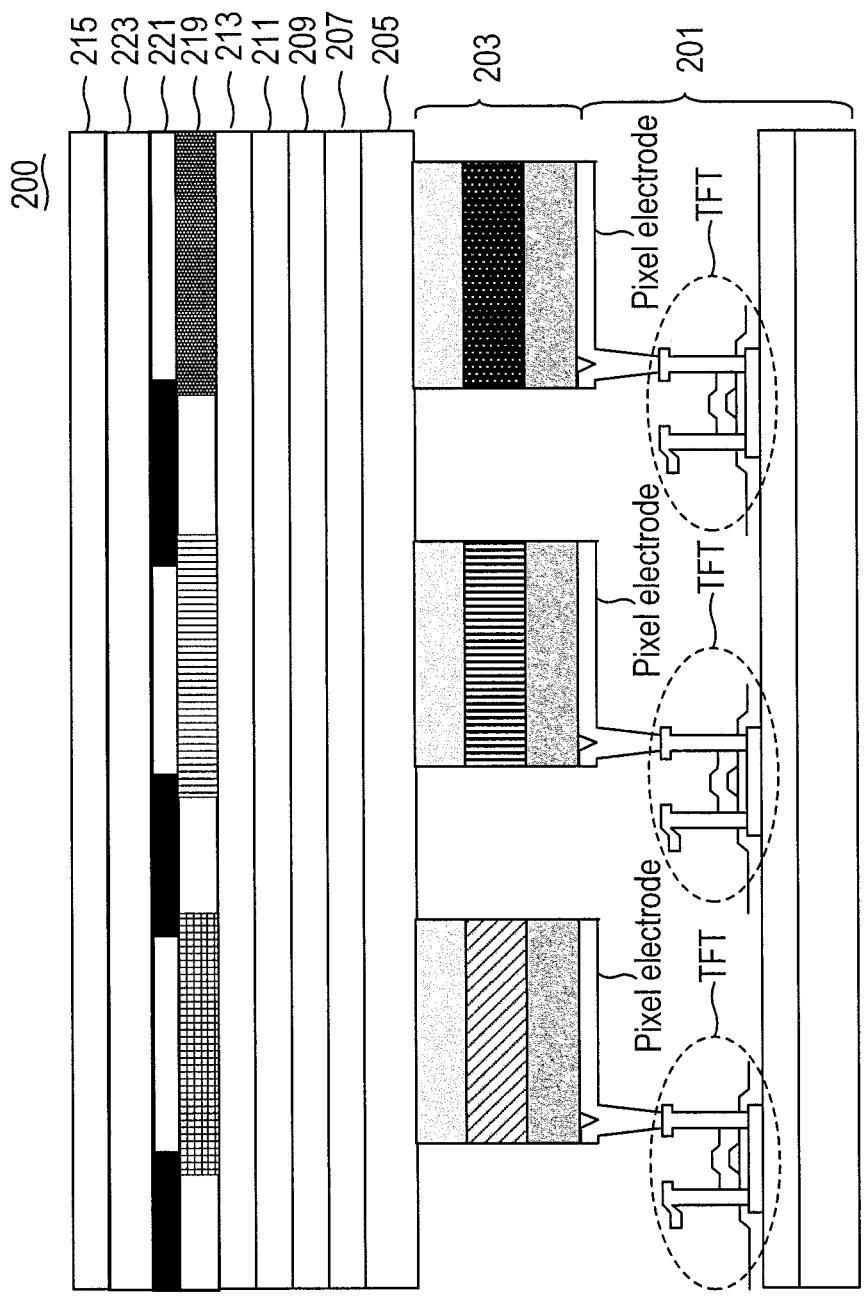
FIG. 9 is a second stack-up diagram of the in-cell OLED touch display panel structure with high touch detection sensitivity and narrow border in accordance with the present disclosure.

FIG. 9 is a second stack-up diagram of the in-cell OLED touch display panel structure with high touch detection sensitivity and narrow border in accordance with the present disclosure, which is similar to FIG. 2 except that, in FIG. 9, there are a color filter layer 219, a black matrix layer 221 and a substrate disposed between the touch protective layer 215 and the first electrode layer 213. The color filter layer 219 is disposed at one side of the common electrode layer 205 opposite to the OLED layer 203. The black matrix layer 221 is disposed at one side of the color filter layer 219 opposite to the OLED layer 203.

Figure 10:
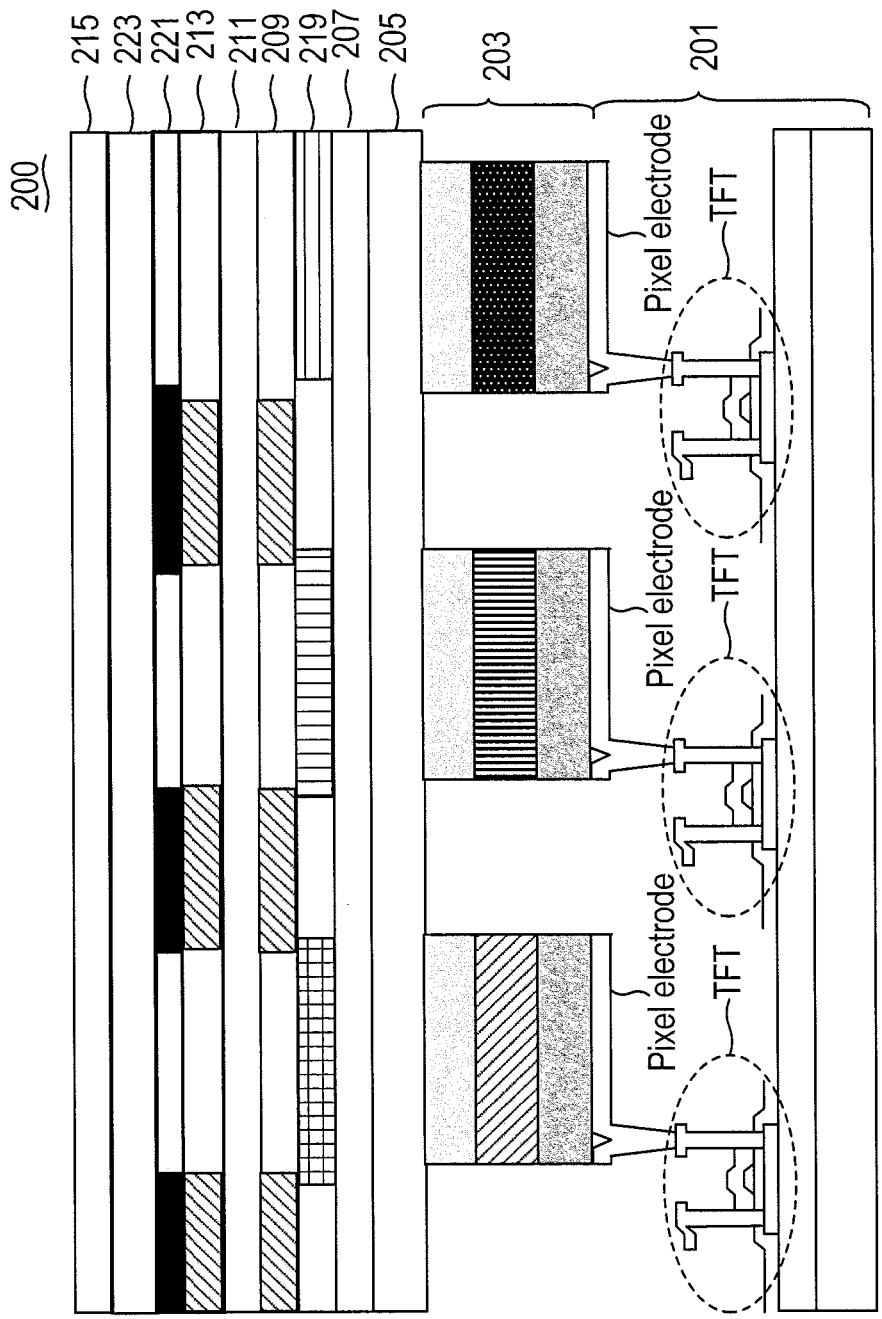
FIG. 10 is a third stack-up diagram of the in-cell OLED touch display panel structure with high touch detection sensitivity and narrow border in accordance with the present disclosure.

FIG. 10 is a third stack-up diagram of the in-cell OLED touch display panel structure with high touch detection sensitivity and narrow border in accordance with the present disclosure, which is similar to FIG. 9 except that, in FIG. 10, the second electrode layer 209, the insulation layer 211 and the first electrode layer 213 are disposed between the color filter layer 219 and the black matrix layer 221, and each of the first electrodes and the second electrodes is a metal mesh electrode.

FIG. 11 is a schematic view of the black matrix layer, first electrode layer, second electrode layer and the TFT substrate of the in-cell OLED touch display panel structure, as shown by FIG. 10, in accordance with the present disclosure. As shown, the black matrix layer 221 includes a plurality of opaque lines 1110 with insulating material that are black and opaque. The opaque lines 1110 of black insulating material are arranged as a checkerboard pattern. The locations of the opaque lines 1110 of black insulating material are corresponding to the locations of the gate lines 1120 and data lines 1130. Thus, in viewing the touch display panel, a user will not sense the existence of the gate lines 1120 and data lines 1130.

Each of the first electrodes 320 and the second electrodes 350 is a metal mesh electrode formed by mesh lines 1140, and the mesh lines 1140 of the first electrodes 320 and the second electrodes 350 are disposed at locations corresponding to opaque lines 1110 of the black matrix layer 221.

The mesh line 1140 is formed of conductive metal material which is selected from the group consisting of chromium, barium, aluminum, silver, copper, titanium, nickel, tantalum, cobalt, tungsten, magnesium, calcium, potassium, lithium, indium, and an alloy thereof.

Figure 12:
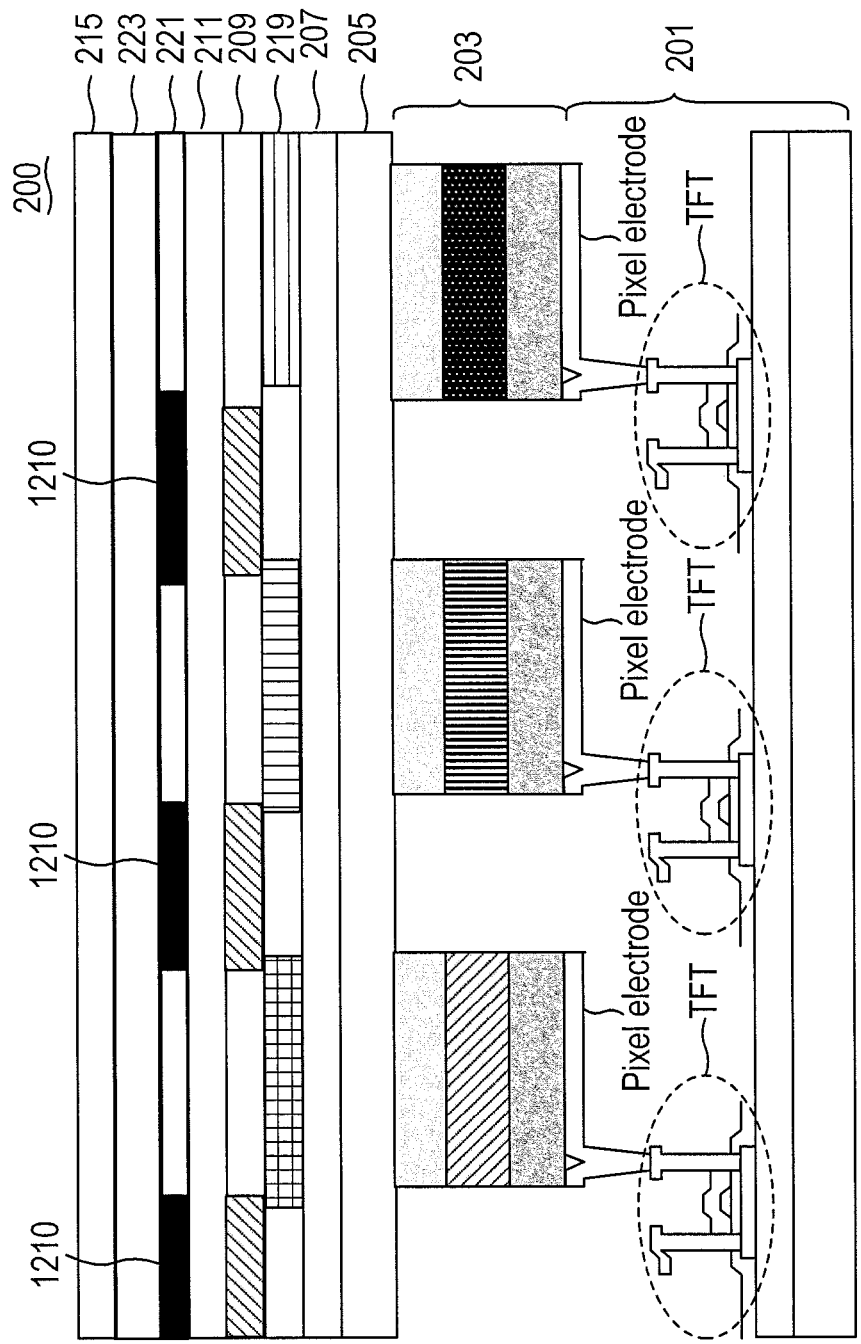
FIG. 12 is a fourth stack-up diagram of the in-cell OLED touch display panel structure with high touch detection sensitivity and narrow border in accordance with the present disclosure.

FIG. 12 is a fourth stack-up diagram of the in-cell OLED touch display panel structure with high touch detection sensitivity and narrow border in accordance with the present disclosure, which is similar to FIG. 10 except that, in FIG. 12, the first electrode layer is removed. The black matrix layer 221 includes a plurality of opaque lines 1210 with black conductive material. The locations of the opaque lines 1210 of black conductive material in the black matrix layer 221 are corresponding to the locations of the gate lines 1120 and data lines 1130 (as those shown by FIG. 11). Corresponding to the second electrode layer 209, the opaque lines 1210 of black conductive material may be formed to be an electrode layer in order to replace the first electrode layer 213.

Figure 13:
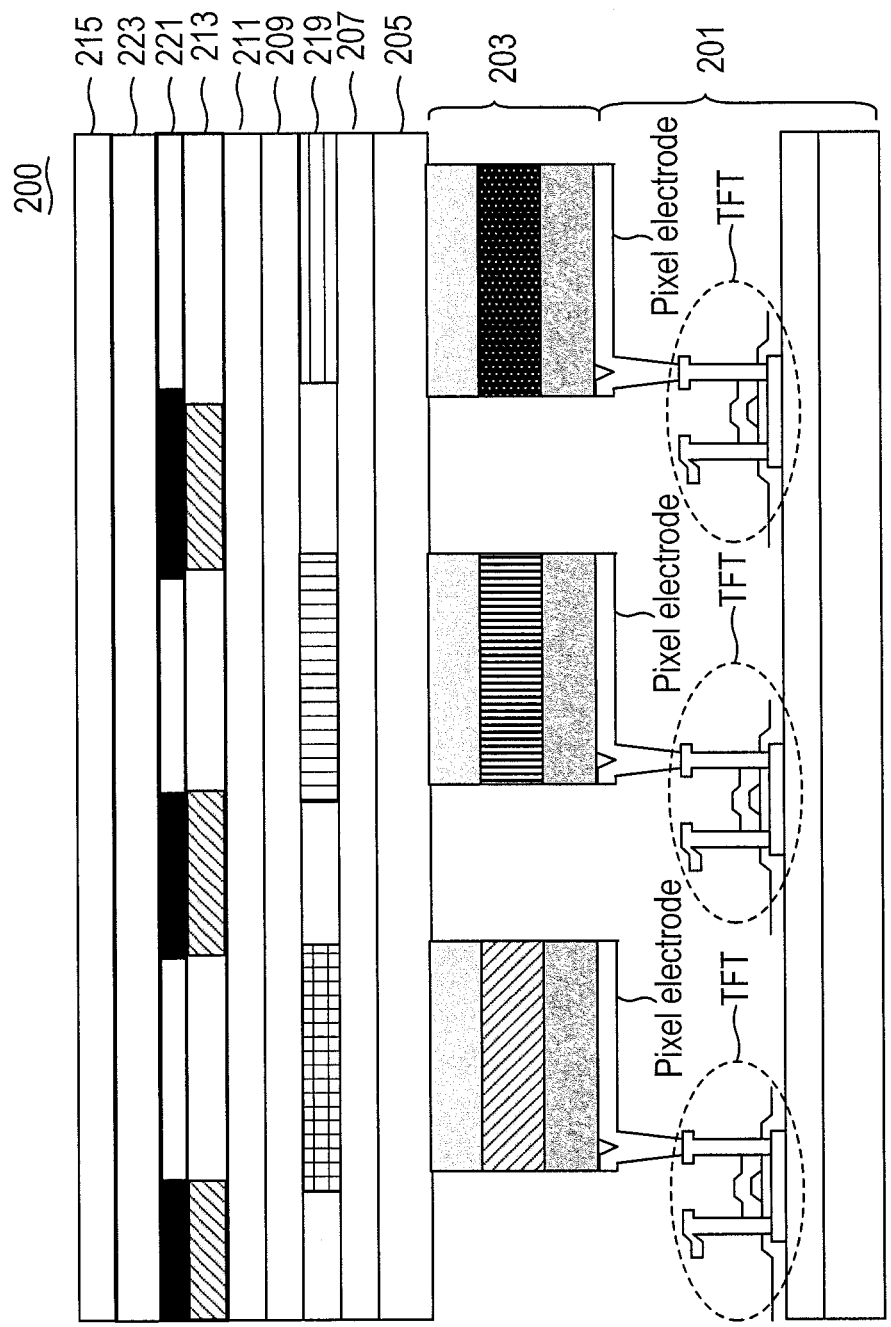
FIG. 13 is a fifth stack-up diagram of the in-cell OLED touch display panel structure with high touch detection sensitivity and narrow border in accordance with the present disclosure.

FIG. 13 is a fifth stack-up diagram of the in-cell OLED touch display panel structure with high touch detection sensitivity and narrow border in accordance with the present disclosure, which is similar to FIG. 10 except that, in FIG. 13, the second electrodes (as shown by FIG. 7 with numerals 350) of the second electrode layer 209 is a transparent conductive electrode made of transparent material selected from the group consisting of ITO, ZTO, IZO, conductive polymer, carbon nanotube, graphene, and silver film with a thickness smaller than 50 nanometers.

Figure 14:
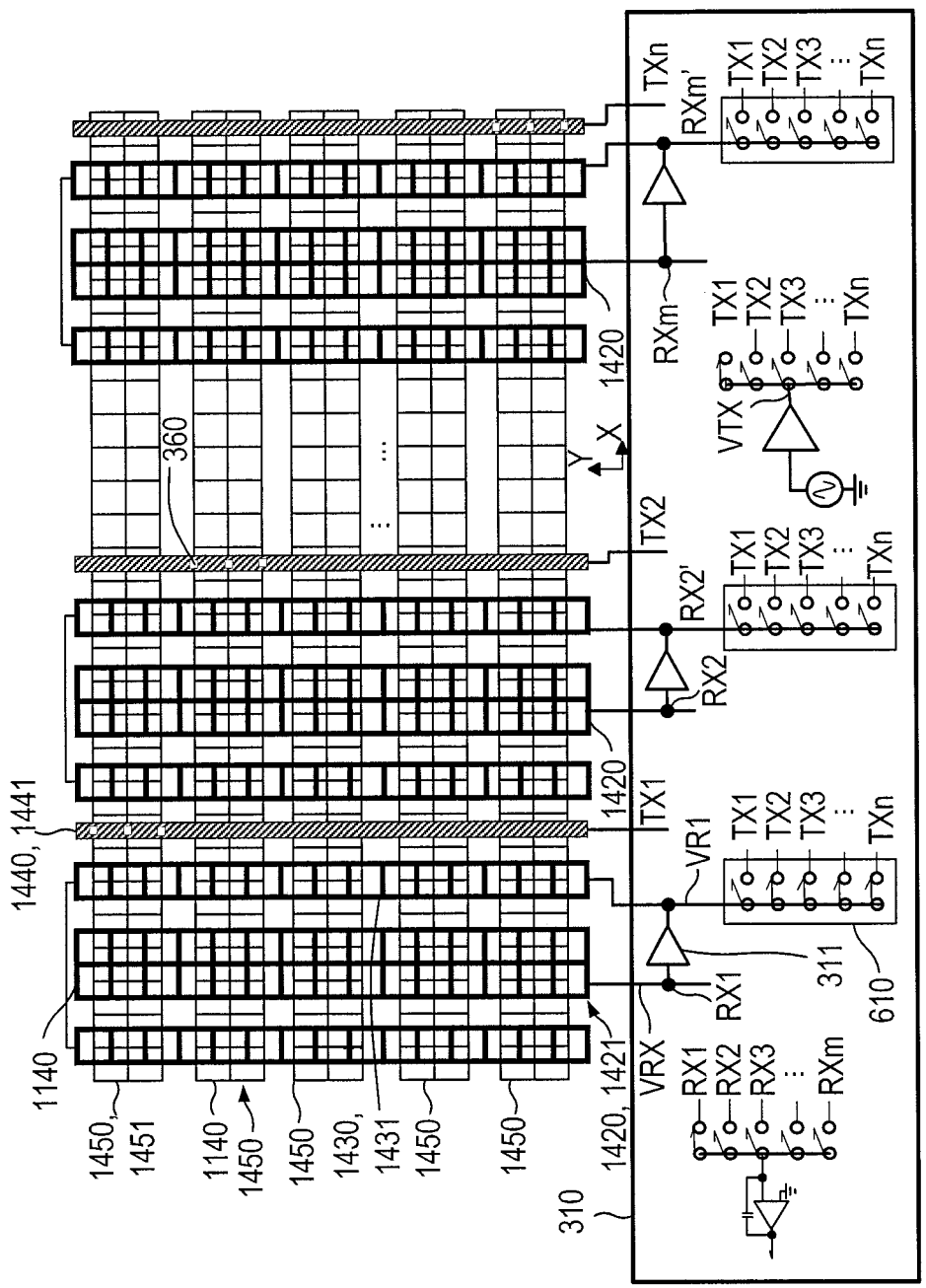
FIG. 14 is a seventh schematic diagram of the first electrode layer, second electrode layer and touch control circuit of the in-cell OLED touch display panel structure in accordance with the present disclosure.

FIG. 14 is a seventh schematic diagram of the first electrode layer, second electrode layer and touch control circuit in accordance with the present disclosure. With reference to both FIG. 2, FIG. 10, FIG. 12 and FIG. 14, the in-cell OLED touch display panel structure 200 includes a thin film transistor (TFT) substrate 201, an OLED layer 203, a common electrode layer 205, an encapsulation layer 207, a second electrode layer 209, an insulation layer 211, a first electrode layer 213, a touch protective layer 215, a display control circuit 217, and a touch control circuit 310.

The TFT substrate 201 has a surface formed thereon a plurality of display TFTs, a plurality of display pixel electrodes, a plurality of gate lines 1120, and a plurality of data lines 1130.

The OLED layer 203 is disposed between the TFT substrate 201 and the common electrode layer 205.

The encapsulation layer 207 is disposed at one side of the common electrode layer 205 opposite to the OLED layer 203.

The second electrode layer 209 is disposed at one side of the encapsulation layer 207 opposite to the OLED layer 203.

The first electrode layer 213 is disposed at one side of the encapsulation layer 207 opposite to the OLED layer 203.

The insulation layer 211 is disposed between the first electrode layer 213 and the second electrode layer 209.

The touch protective layer 215 is disposed at one side of the encapsulation layer 207 opposite to the OLED layer 203.

The display control circuit 217 sequentially outputs a scan signal to one gate line (not shown), outputs data signals to corresponding data lines (not shown), and outputs a zero voltage signal, a negative voltage signal or a positive voltage signal to the common electrode layer 205 for performing a display operation.

The first electrode layer 213 includes a plurality of first mesh electrodes 1420 arranged along a first direction (X-axis direction), a plurality of isolation electrodes 1430, and a plurality of second mesh electrode connection lines 1440.

The second electrode layer 209 includes a plurality of second mesh electrodes 1450 arranged along a second direction (Y-axis direction). Each of the second mesh electrodes 1450 extends to one edge of the in-cell OLED touch display panel structure 200 through a corresponding second mesh electrode connection line 1440.

The first electrode layer 213 and the second electrode layer 209 are both disposed at one side of the common electrode layer 205 opposite to the OLED layer 203.

Each of the first mesh electrodes 1420 and the second mesh electrodes 1450 is a black metal electrode. Alternatively, each of the first mesh electrodes 1420 and the second mesh electrodes 1450 is a metal mesh electrode formed by mesh lines 1140, and the mesh lines 1140 of the first mesh electrodes 1420 and the second mesh electrodes 1450 are disposed at locations corresponding to opaque lines (as shown by FIG. 11 with numerals 1110) of the black matrix layer 221.

As shown in FIG. 14, the mesh lines of the first mesh electrodes 1420 and mesh lines of the second mesh electrodes 1450 are dislocated and non-overlapped with each other. The isolation electrode 1430 is arranged between one first mesh electrode 1420 and one second mesh electrode connection line 1440.

The touch control circuit 310 sequentially or randomly couples a touch stimulation signal VTX to a selected second mesh electrode 1451 by the second mesh electrode connection lines 1441, and receives a touch sense signal VRX from a selected first mesh electrode 1421. The touch sense signal VRX is driven by an in-phase amplifier 311 to generate an in-phase isolation signal VR1, wherein the in-phase amplifier 311 has a gain greater than 0. The in-phase isolation signal VR1 is coupled to the isolation electrodes 1431 corresponding to the selected first mesh electrode 1421 for performing the touch detection operation.

The touch control circuit 310 couples the in-phase isolation signal VR1 to the second mesh electrodes 1450 exclusive of the selected second mesh electrode 1451.

Figure 1:
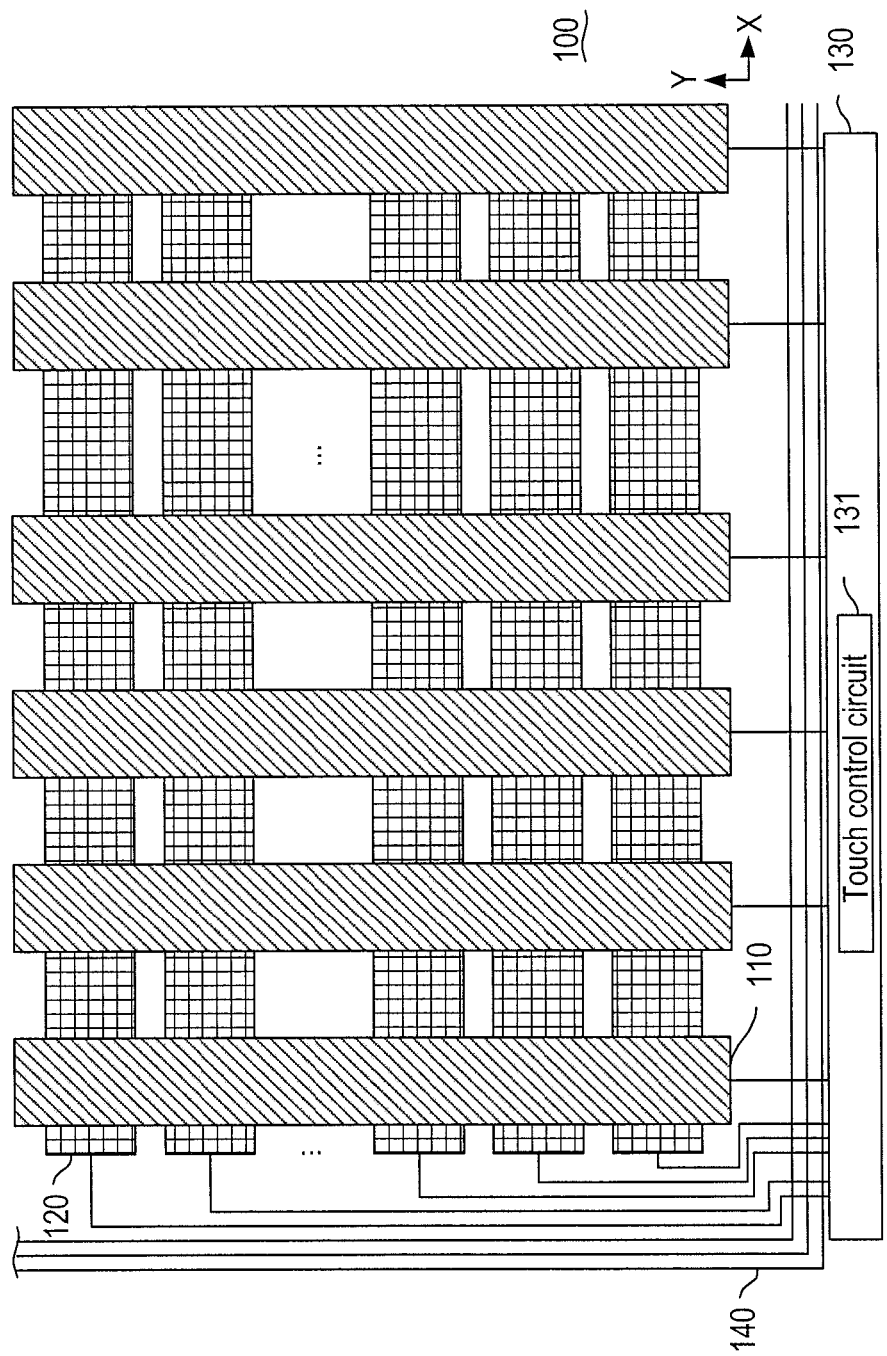
FIG. 1 is a schematic diagram of a prior touch panel structure.

In view of the foregoing, it is known that the prior design as in FIG. 1 shall increase the border width of the touch panel and thus is not suitable for the trend of narrow border. According to the in-cell OLED touch display panel structure with high touch detection sensitivity and narrow border in accordance with the present invention, the border of the OLED touch display panel becomes narrower.

Owing to the isolation electrode 331 being arranged between the selected first electrode 321 and the second electrode connection line 341, it can prevent the selected first electrode 321 from being interfered by a touch stimulation signal VTX on the second electrode connection line 341. Thus, the touch detection accuracy can be dramatically increased.

The mesh lines of the first electrodes and the second electrodes are disposed at locations corresponding to opaque lines of the black matrix layer, and thus the present disclosure has a better light penetration rate in comparison with the prior art.

Although the present invention has been explained in relation to its preferred embodiment, it is to be understood that many other possible modifications and variations can be made without departing from the spirit and scope of the invention as hereinafter claimed.

What is claimed is:

1. An in-cell OLED touch display panel structure with high touch detection sensitivity and narrow border, comprising:
   a thin film transistor (TFT) substrate having a surface formed thereon a plurality of display TFTs, a plurality of display pixel electrodes, a plurality of gate lines, and a plurality of data lines;
   a common electrode layer;
   an OLED layer disposed between the TFT substrate and the common electrode layer;
   an encapsulation layer disposed at one side of the common electrode layer opposite to the OLED layer;
   a first electrode layer including a plurality of first electrodes arranged along a first direction, a plurality of isolation electrodes, and a plurality of second electrode connection lines; and
   a second electrode layer including a plurality of second electrodes arranged along a second direction, each of the second electrodes extending to one edge of the in-cell OLED touch display panel structure through a corresponding second electrode connection line;
   wherein the first electrode layer and the second electrode layer are both disposed at one side of the common electrode layer opposite to the OLED layer.

2. The in-cell OLED touch display panel structure with high touch detection sensitivity and narrow border as claimed in claim 1, wherein the isolation electrode is arranged between one first electrode and one second electrode connection line.

3. The in-cell OLED touch display panel structure with high touch detection sensitivity and narrow border as claimed in claim 1, further comprising:

a touch control circuit for sequentially or randomly coupling a touch stimulation signal to a selected second electrode, receiving a touch sense signal from a selected first electrode, coupling the touch sense signal to an in-phase amplifier to generate an in-phase isolation signal, and coupling the in-phase isolation signal to the isolation electrodes corresponding to the selected first electrode for performing the touch detection operation.

4. The in-cell OLED touch display panel structure with high touch detection sensitivity and narrow border as claimed in claim 3, wherein the touch control circuit couples the in-phase isolation signal to the second electrodes exclusive of the selected second electrode.

5. The in-cell OLED touch display panel structure with high touch detection sensitivity and narrow border as claimed in claim 1, further comprising:
a display control circuit for sequentially outputting a scan signal to one gate line, outputting data signals to corresponding data lines, and outputting a zero voltage signal, a negative voltage signal or a positive voltage signal to the common electrode layer for performing a display operation.

6. The in-cell OLED touch display panel structure with high touch detection sensitivity and narrow border as claimed in claim 1, wherein the first electrodes and the second electrodes are each a transparent conductive electrode.

7. The in-cell OLED touch display panel structure with high touch detection sensitivity and narrow border as claimed in claim 1, wherein the first electrodes or the second electrodes are each a black metal mesh electrode.

8. The in-cell OLED touch display panel structure with high touch detection sensitivity and narrow border as claimed in claim 1, further comprising:
a color filter layer disposed at one side of the common electrode layer opposite to the OLED layer; and
a black matrix layer disposed at one side of the color filter layer opposite to the OLED layer.

9. The in-cell OLED touch display panel structure with high touch detection sensitivity and narrow border as claimed in claim 8, wherein the first electrodes and the second electrodes are each a metal mesh electrode formed by mesh lines, and the mesh lines of the metal mesh electrodes are disposed at locations corresponding to opaque lines of the black matrix layer.

10. The in-cell OLED touch display panel structure with high touch detection sensitivity and narrow border as claimed in claim 1, further comprising:
an insulation layer disposed between the plurality of first electrodes and the plurality of second electrodes.

11. An in-cell OLED touch display panel structure with high touch detection sensitivity and narrow border, comprising:
a thin film transistor (TFT) substrate having a surface formed thereon a plurality of display TFTs, a plurality of display pixel electrodes, a plurality of gate lines, and a plurality of data lines;
a common electrode layer;
an OLED layer disposed between the TFT substrate and the common electrode layer;
an encapsulation layer disposed at one side of the common electrode layer opposite to the OLED layer;
a first electrode layer including a plurality of first mesh electrodes arranged along a first direction, a plurality of isolation electrodes, and a plurality of second mesh electrode connection lines; and
a second electrode layer including a plurality of second mesh electrodes arranged along a second direction, each of the second mesh electrodes extending to one edge of the in-cell OLED touch display panel structure through a corresponding second mesh electrode connection line;
wherein the first electrode layer and the second electrode layer are both disposed at one side of the common electrode layer opposite to the OLED layer, and mesh lines of the first mesh electrodes and mesh lines of the second mesh electrodes are dislocated and non-overlapped with each other.

12. The in-cell OLED touch display panel structure with high touch detection sensitivity and narrow border as claimed in claim 11, wherein the isolation electrode is arranged between one first mesh electrode and one second mesh electrode connection line.

13. The in-cell OLED touch display panel structure with high touch detection sensitivity and narrow border as claimed in claim 11, further comprising:
a touch control circuit for sequentially or randomly coupling a touch stimulation signal to a selected second mesh electrode, receiving a touch sense signal from a selected first mesh electrode, coupling the touch sense signal to an in-phase amplifier to generate an in-phase isolation signal, and coupling the in-phase isolation signal to the isolation electrodes corresponding to the selected first mesh electrode for performing the touch detection operation.

14. The in-cell OLED touch display panel structure with high touch detection sensitivity and narrow border as claimed in claim 13, wherein the touch control circuit couples the in-phase isolation signal to the second mesh electrodes exclusive of the selected second mesh electrode.

15. The in-cell OLED touch display panel structure with high touch detection sensitivity and narrow border as claimed in claim 11, further comprising:
a display control circuit for sequentially outputting a scan signal to one gate line, outputting data signals to corresponding data lines, and outputting a zero voltage signal, a negative voltage signal or a positive voltage signal to the common electrode layer for performing a display operation.

16. The in-cell OLED touch display panel structure with high touch detection sensitivity and narrow border as claimed in claim 11, wherein the first mesh electrodes or the second mesh electrodes are each a black metal electrode.

17. The in-cell OLED touch display panel structure with high touch detection sensitivity and narrow border as claimed in claim 11, further comprising:
a color filter layer disposed at one side of the common electrode layer opposite to the OLED layer; and
a black matrix layer disposed at one side of the color filter layer opposite to the OLED layer.

18. The in-cell OLED touch display panel structure with high touch detection sensitivity and narrow border as claimed in claim 17, wherein the first mesh electrodes and the second mesh electrodes are each a metal mesh electrode formed by mesh lines, and the mesh lines of the metal mesh electrodes are disposed at locations corresponding to opaque lines of the black matrix layer.

* * * * *